(12) United States Patent
Wu

(10) Patent No.: US 9,287,218 B2
(45) Date of Patent: Mar. 15, 2016

(54) CHIP LEVEL EMI SHIELDING STRUCTURE AND MANUFACTURE METHOD THEREOF

(75) Inventor: Ming-Che Wu, Nantou County (TW)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 625 days.

(21) Appl. No.: 13/053,528

(22) Filed: Mar. 22, 2011

(65) Prior Publication Data

US 2012/0086108 A1 Apr. 12, 2012

(30) Foreign Application Priority Data

Oct. 8, 2010 (TW) .............................. 99134475 A

(51) Int. Cl.
| | |
|---|---|
| H01L 23/52 | (2006.01) |
| H01L 23/552 | (2006.01) |
| H01L 23/498 | (2006.01) |
| H01L 25/00 | (2006.01) |
| H01L 23/31 | (2006.01) |
| H01L 23/00 | (2006.01) |
| H01L 25/065 | (2006.01) |

(52) U.S. Cl.
CPC ........ H01L 23/552 (2013.01); H01L 23/49805 (2013.01); H01L 25/50 (2013.01); H01L 23/3121 (2013.01); H01L 24/16 (2013.01); H01L 24/97 (2013.01); H01L 25/0655 (2013.01); H01L 2224/97 (2013.01); H01L 2924/157 (2013.01)

(58) Field of Classification Search
CPC . H01L 23/49805; H01L 23/552; H01L 25/50; H01L 23/3121; H01L 24/16; H01L 24/97; H01L 25/0655; H01L 2924/157; H01L 2224/97; H01L 2224/81

USPC ........... 257/659, E21.599, E21.502, E23.114; 438/460, 113

See application file for complete search history.

(56) References Cited

U.S. PATENT DOCUMENTS

| | | | |
|---|---|---|---|
| 6,297,551 B1 * | 10/2001 | Dudderar et al. | ............. 257/723 |
| 6,509,807 B1 * | 1/2003 | Anthony et al. | ................ 333/12 |
| 7,180,012 B2 | 2/2007 | Tsuneoka et al. | |
| 8,039,969 B2 | 10/2011 | Kurita | |
| 2009/0079041 A1 | 3/2009 | Huang et al. | |
| 2009/0256244 A1 * | 10/2009 | Liao et al. | ..................... 257/660 |

FOREIGN PATENT DOCUMENTS

| | | |
|---|---|---|
| CN | 1387741 A | 12/2002 |
| JP | H9-135103 A | 5/1997 |
| JP | 2001-135775 A | 5/2001 |

(Continued)

OTHER PUBLICATIONS

Communication From the Taiwan Patent Office Regarding a Counterpart Foerign Application Dated (Taiwan Year 103) Feb. 24, 2014.

*Primary Examiner* — Hrayr A Sayadian
(74) *Attorney, Agent, or Firm* — Rosenberg, Klein & Lee

(57) ABSTRACT

A chip level EMI shielding structure and manufacture method thereof are provided. The chip level EMI shielding structure includes a semiconductor substrate, at least one ground conductor line, a ground layer, and a connection structure. The ground conductor line is disposed on a first surface of the semiconductor substrate, and the ground layer is disposed on a second surface of the semiconductor substrate. The connection structure is formed on a lateral wall of the semiconductor substrate for connecting the ground conductor lines with the ground layer to form a shielding. With such arrangement, the chip level EMI shielding structure can reduce the chip size and the manufacturing cost.

5 Claims, 4 Drawing Sheets

(56) References Cited

FOREIGN PATENT DOCUMENTS

| | | |
|---|---|---|
| JP | 2004-95607 A | 3/2004 |
| JP | 2007-103839 A | 4/2007 |
| JP | 2010-225752 A | 10/2010 |
| WO | 01/19134 A2 | 3/2001 |
| WO | 2007/060784 A1 | 5/2007 |

\* cited by examiner

CHIP LEVEL EMI SHIELDING STRUCTURE AND MANUFACTURE METHOD THEREOF

BACKGROUND OF THE INVENTION

1. Field of the Invention

The present invention relates to an EMI shielding structure; in particular, the invention relates to a chip level EMI shielding structure and manufacture method thereof. Wherein a conformal shielding is formed on the rear of the wafer to suppress the electromagnetic interference (EMI).

2. Description of the Related Art

Integrated circuit industry mainly comprises the IC (Integrated Circuit) design, IC manufacturing and chip test. It is important for the stability of the IC that the chip structure would directly affect the electric ability, mechanical ability, thermal ability, and the light sensitivity of the IC. Therefore, the chip structure has already become the core technique in the electronics industry.

At present, the chip mainly uses a printed circuit board as a substrate, and the chip would be disposed on the substrate, and the conducting pin of the chip connected outward via the substrate. Either a ground layer or metal layer would be disposed on the substrate to suppress the electromagnetic interference. In general, the metal layer is formed on the surface of the substrate or the inner layer of the substrate. However, as the electric products are becoming thinner, the conventional chip structure and design of preventing electromagnetic interference have become outdated.

SUMMARY OF THE INVENTION

A chip level EMI shielding structure and manufacture method thereof are provided. A ground layer, a first connection structure, and a second connection structure are formed on the rear and the lateral side of the wafer to form a conformal shielding so as to suppress the electromagnetic interference and minimize the size of the chip level EMI shielding structure at the same time.

The chip level EMI shielding structure is used for being disposed at least one chip, the chip level EMI shielding structure comprises a semiconductor substrate, at least one ground conductor line, a ground layer and a first connection structure and a second connection structure. A first surface of the semiconductor substrate has a redistribution layer. The ground layer is disposed on a second surface of the semiconductor substrate extending between the first connection structure and the second connection structure respectively disposed on lateral walls of the semiconductor substrate for electrically connecting the ground conductor lines and the ground layer. The ground conductor line is disposed on the first surface and on the brink of the semiconductor substrate.

The semiconductor substrate is a Si-based substrate of an embodiment of the instant disclosure. The first connection structure and the second connection structure are respectively formed on the lateral walls of the semiconductor substrate applied in non-plating process. The redistribution layer comprises a plurality of metal conductor lines for using to be electrically connected with at least one chip.

At least one chip is disposed on a first surface of the semiconductor substrate of an embodiment of the instant disclosure. The chip level EMI shielding structure further comprises a protective layer covered on at least one chip. The protective layer has a plurality of metal conductor lines for use to be electrically connected with the redistribution layer.

A manufacture method of chip level EMI shielding structure comprises the following steps: forming a redistribution layer on a first surface of a wafer; forming at least one ground conductor line on the first surface of the wafer; disposing at least one chip on the first surface of the wafer and disposing the ground conductor line in between the chips; forming a ground layer on a second surface of the wafer; cutting the wafer into a plurality of semiconductor substrate, and the ground conductor lines are respectively disposed on the edge of the semiconductor substrate; and then forming a first connection structure and a second connection structure respectively on lateral walls of one of the semiconductor substrate, wherein the first connection structure and the second connection structure are used for being correspondingly connected with the ground conductor lines and the ground layer of the semiconductor substrate.

As mentioned above, metal layer may be plated on the rear surface and the lateral surface of the semiconductor to form the conformal shielding, and the circuit is designed in a protective layer. With this arrangement, a printed circuit board can be omitted, and therefore reducing the cost and volume.

In order to further appreciate the characteristics and technical contents of the present invention, references are hereunder made to the detailed descriptions and appended drawings in connection with the present invention. However, the appended drawings are merely shown for exemplary purposes, rather than being used to restrict the scope of the present invention.

DETAILED DESCRIPTION OF THE PREFERRED EMBODIMENT

Figure 1:
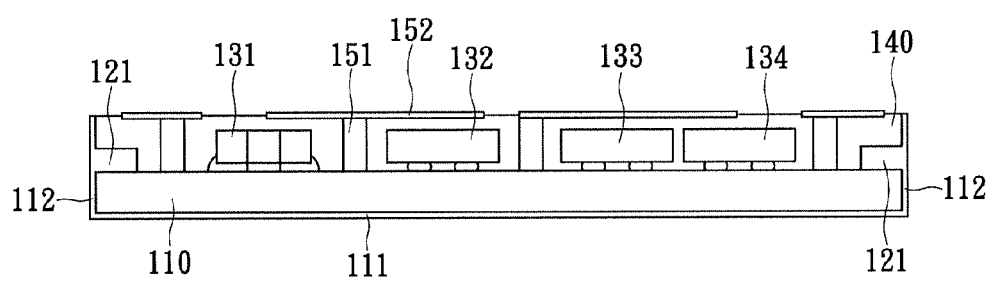
FIG. 1 is a schematic view of the chip level EMI shielding structure of the first embodiment of the present invention.

Referring to FIG. 1, which shows the first embodiment of the chip level EMI shielding structure of the instant disclosure. The chip level EMI shielding structure comprises a semiconductor substrate 110, a ground layer 111, a first connection structure 112a, a second connection structure 112b, at least one ground conductor line 121, and a protective layer 140. The upper surface (first surface) of the semiconductor substrate 110 has a redistribution layer (RDL) for connecting with chips 131~134. Furthermore, the redistribution layer has a plurality of metal conductor lines for connecting the chips 131~134 or transmitting the communication signal. The ground conductor line 121 is disposed on the first surface and on the edge of the semiconductor substrate 110. The lower surface (second surface) of the semiconductor substrate 110 has a metal layer spreading the entire lower surface, and the metal layer is a ground layer 111. The first and second connection structures 112a, 112b are formed on the lateral walls of the semiconductor substrate 110, and the ground layer 111 is connected to the ground conductor line 121 via the first and second connection structures 112a, 112b in forming a conformal shielding. It should be noted herein, the ground layer 111, the first and second connection structures 112a, 112b, and the ground connector line 121 can be formed by sputtering method, but is not restricted herein.

The ground conductor line of the chips 131~134 may be connected to the ground conductor line 121 via the redistribution layer. The ground layer 111 and the ground conductor line 121 would form a metallic shielding effect to suppress the electromagnetic interference (EMI). The first and second connection structures 112a, 112b may be formed on the lateral wall of the semiconductor substrate 110 by the non-plating process and laser-treated process, which are mainly used to connect the ground conductor line 121 on the upper and lower surfaces with the ground layer 111. Furthermore, the ground conductor pins of the chips 131~134 may be connected to the ground conductor line 121 via the redistribution layer.

The chips 131~134 are disposed on the upper surface of the semiconductor substrate 110 by the flip-chip technique. The protective layer 140 covers the chips 131~134 to protect the chips 131~134. The protective layer 140 is made of a molding compound. A metal conductor line 151 is formed in the protective layer 140 by drilling or plating a hole. Thus, the input/output conducting pins of the chips 131~134 are connected to the metal conductor line 152 over the protective layer 140. The semiconductor substrate 110 may be of silicon substrate or a substrate material cut from the silicon wafer. The semiconductor substrate 110 of instant disclosure forms a shielding by forming a metal layer spreading over the entire rear surface. With such arrangement, no additional printed circuit board is needed to form the shield during the process. Therefore, the size of the chip level EMI shielding structure could be minimized, the manufacture process can be simplified, and the manufacturing cost can be reduced simultaneously.

Besides, the conducting pins of chips 131~134 may connect to the metal conductor line 152 over the protective layer 140 via the metal conductor line 151, and the exterior circuit may be electrically connected to the chips 131~134 via the metal conductor line 151 and 152. In other words, a circuit is directly disposed on the protective layer 140 for connecting electrically with others. Such structure has the advantage of replacing the printed circuit board substrate. The volume and the manufacturing cost can be reduced at the same time. It should be noted herein, the first and second connection structures 112a, 112b on the lateral walls of the semiconductor substrate 110 are used for connecting the ground layer 111 on the bottom surface of the semiconductor substrate 110 with the ground conductor line 121 on the top surface of the semiconductor substrate 110. The shape and the forming method of the first and second connection structures 112a, 112b are not restricted herein. From the abovementioned embodiment, a person skilled in the art would be able to infer other embodiments. Thus, no further descriptions are given here.

Figure 2:
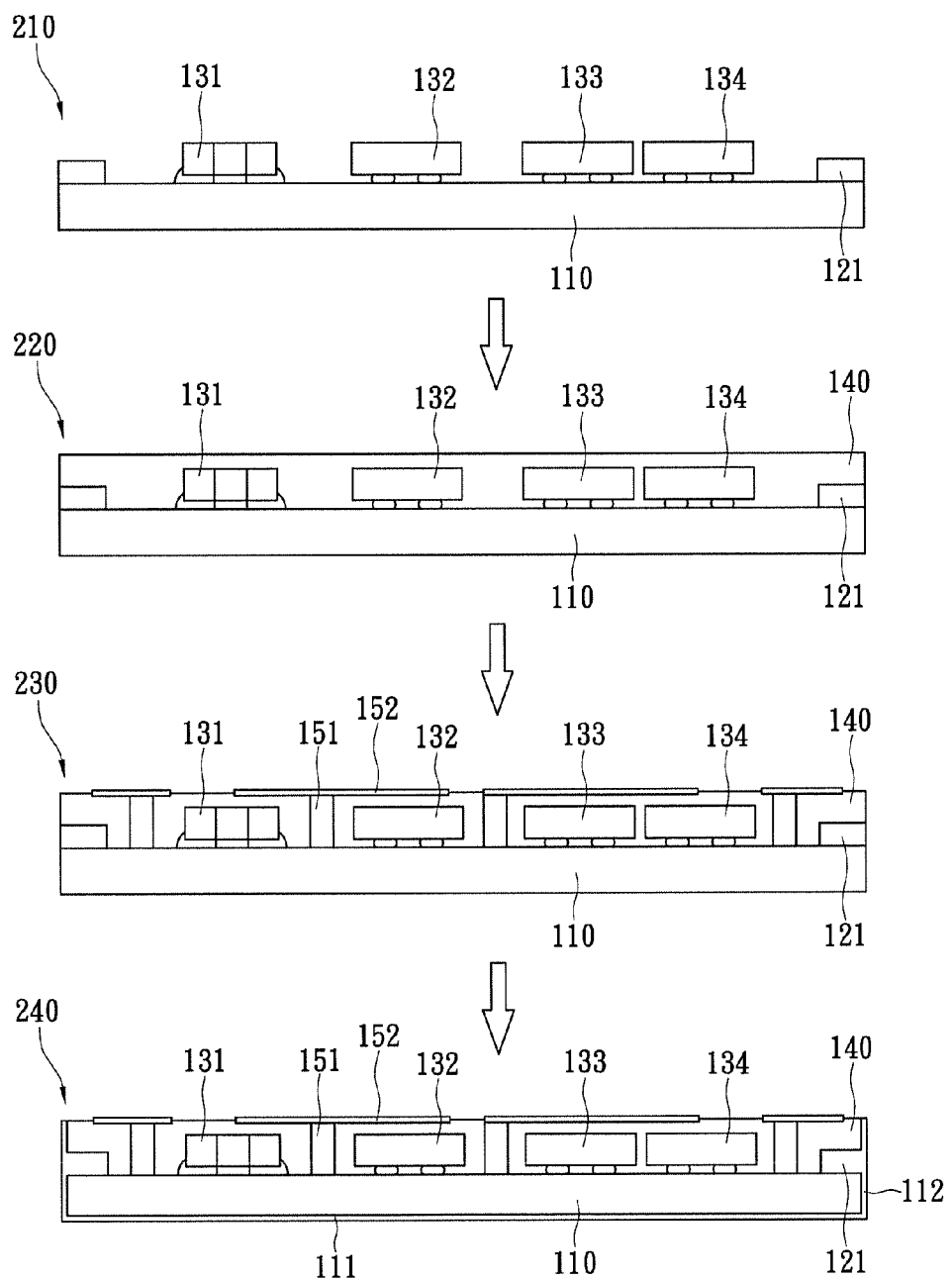
FIG. 2 is a schematic view of the chip process of the second embodiment of the present invention.

In order to achieve the chip level EMI shielding structure aforesaid, the instant disclosure provides a manufacture method of chip level EMI shielding structure. Please refer to FIG. 2 simultaneously, which shows the chip fabrication process as another aspect of the instant disclosure, First, forming a redistribution layer and a ground conductor line 121 on a semiconductor substrate 110 (or on a wafer), and the ground conductor line 121 is disposed on the edge of the semiconductor substrate 110. If the ground conductor line 121 is formed on the wafer, the ground conductor line 121 would be disposed between different chip-disposed regions so that the ground conductor line 121 may be disposed on the edge of the semiconductor substrate 110 after being cut from the wafer. The chips 131~134 are disposed on the semiconductor substrate 110 by the flip-chip technique (referring to structure 210), Next, forming a protective layer 140 on the semiconductor substrate 110. The protective layer 140 is made of molding compound in order to protect the chips 131~134 (referring to structure 220). It should be noted herein, before the wafer is cut, the chip products may be grinded to reduce the thicknesses. The timing of grinding the chip products may be before or after the formation of the redistribution layer, which is not restricted herein, and the thickness of the grinded chip is not restricted herein, too.

Figure 3:
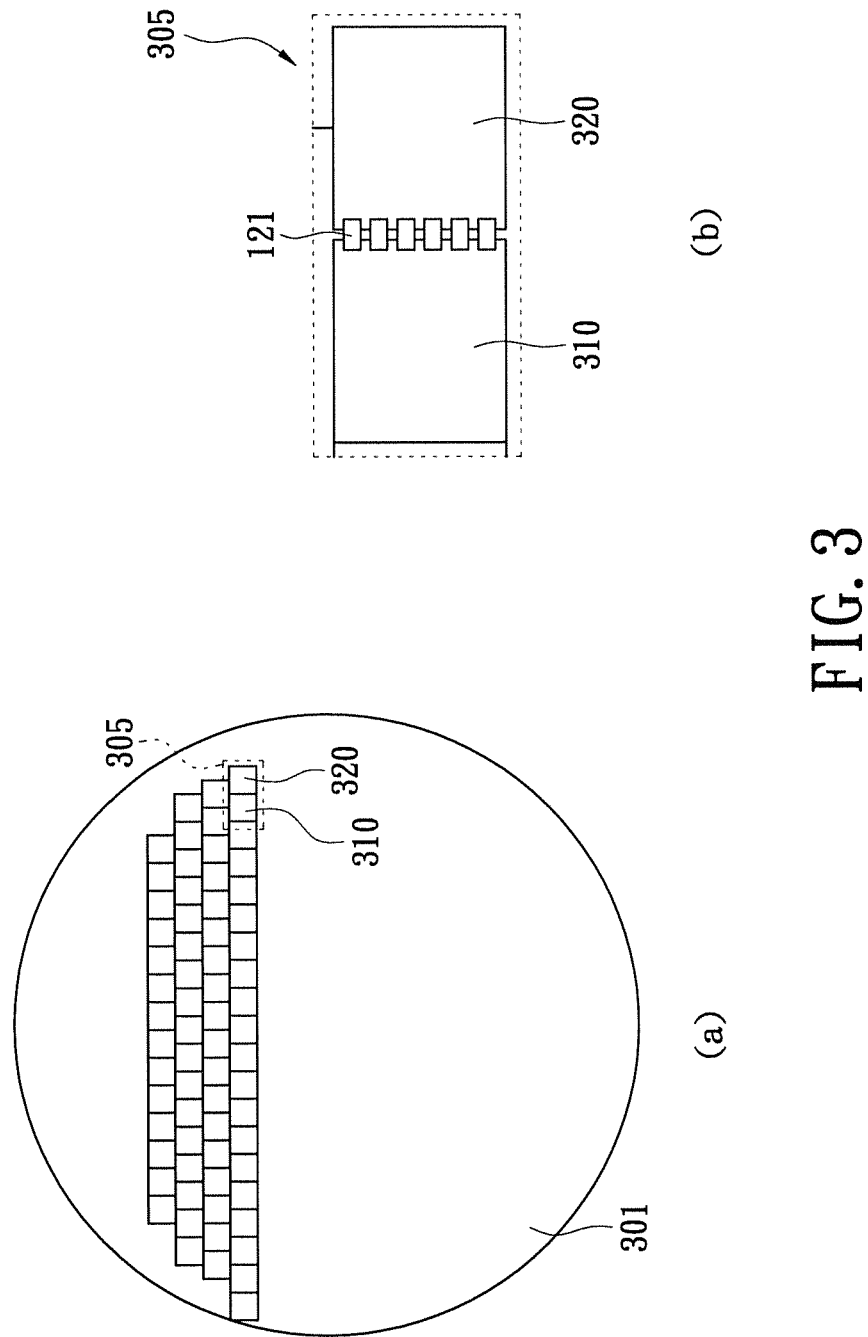
FIG. 3 is a schematic view of wafer structure of the second embodiment of the present invention.

Next, forming a metal conductor line 151 in the protective layer 140 by drilling and filling or plating a hole, and connecting the chips 131~134 to a metal conductor line 152 over the protective layer 140 by the metal conductor line 151 (referring to structure 230). Then, forming a first connection structure 112a and a second connection structure 112b on the lateral walls of the semiconductor substrate 110 for connecting the ground conductor line 121 with the ground layer 111 to form a metallic shielding. It should be noted herein, the structure as foresaid may be applied to the wafer. After forming the protective layer 140, cutting the wafer into a plurality of semiconductor substrates 110. The ground conductor line 121 needs to be disposed on the edge of the semiconductor substrate 110 with precise planning in advance. In this embodiment, the ground conductor line 121 is disposed in between the chips. With such arrangement, the ground conductor line 121 would be disposed on the edge of the semiconductor substrate 110 naturally after the wafer is cut. Please refer to FIG. 3, which shows the schematic diagram of a wafer. Wherein, the FIG. 3(b) is an enlarged view of the region 305 of FIG. 3(a). The chip-disposed regions 310 and 320 are the regions for disposing the chips on the wafer 301 (please refer to FIG. 3(a)), and the ground conductor line 121 is disposed in between the chip-disposed regions 310 and 320 (please refer to FIG. 3(b)). After cutting the wafer along the chip-disposed regions, the ground conductor line 121 would be disposed on the edge of the chip-disposed region 310, which is the edge of the semiconductor substrate 110. Then, a first connection structure 112a and a second connection structure 112b are formed on lateral walls of the semiconductor substrate 110 for connecting the ground conductor line 121 with the ground layer 111.

Figure 4:
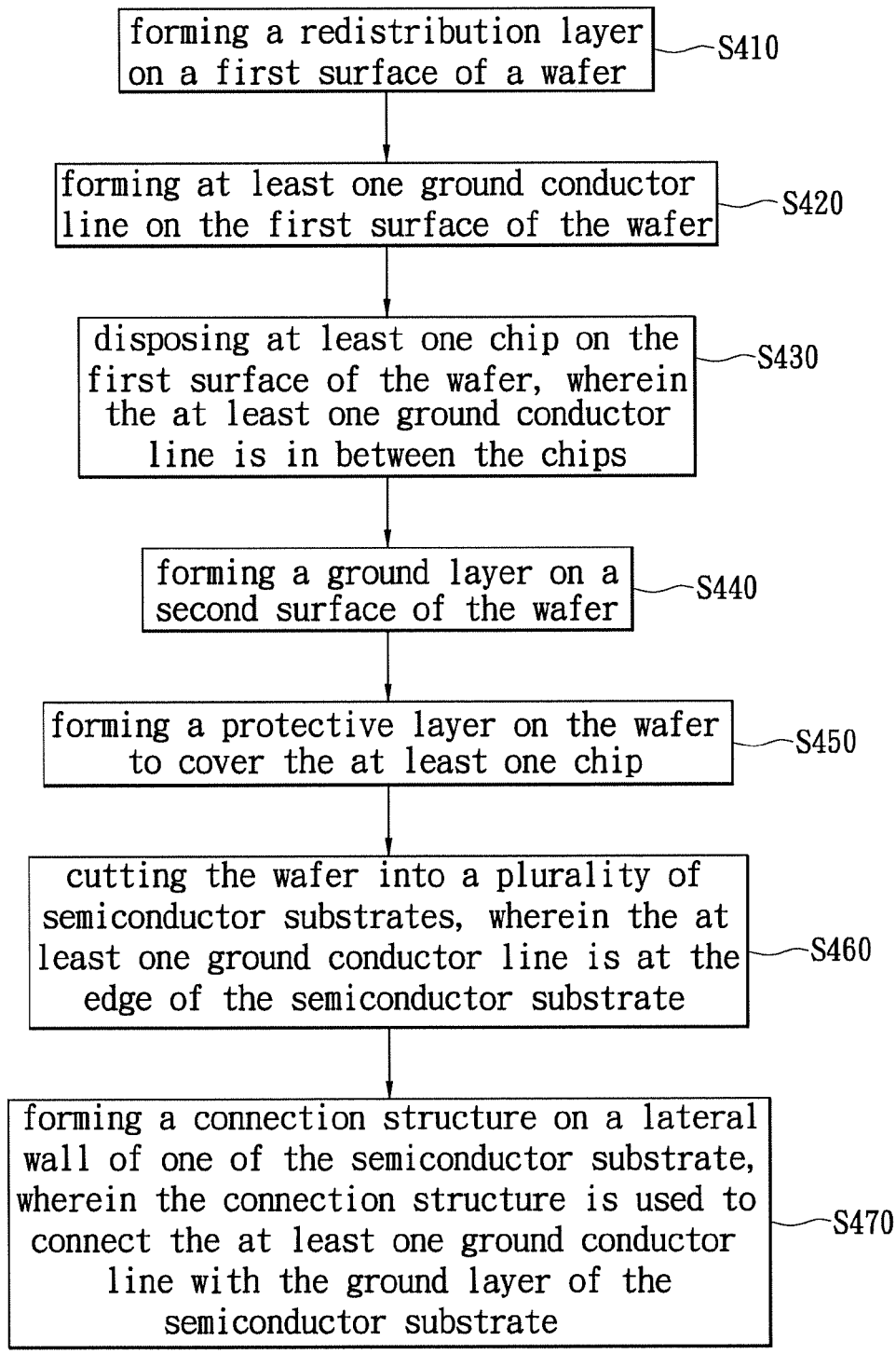
FIG. 4 is a flow diagram of the manufacture method of chip level EMI shielding structure according to the third embodiment of the present invention.

Please refer to FIGS. 3 and 4, wherein FIG. 4 shows the flow diagram of the manufacture method of chip level EMI shielding structure according to the third embodiment of the instant disclosure. First, forming a redistribution layer on a first surface of a wafer (step S410); forming at least one ground conductor line 121 on the first surface of the wafer (step S420); and disposing at least one chip 131~134 on the first surface of the wafer, wherein the at least one ground conductor line 121 is in between the chips 131~134 (step S430). The following step is forming a ground layer 111 on a second surface of the wafer (step S440), and forming a protective layer 140 to cover the at least one chip 131~134 (step S450). After the formation of the protective layer 140 and the metal conductor line 151 and 152, cutting the wafer into a plurality of semiconductor substrates 110, wherein the ground conductor line 121 is at the edge of the semiconductor substrate 110 (step S460). Then, forming a first connection structure 112a and a second connection structure 112b on lateral walls of the semiconductor substrate 110 for connecting the ground conductor line 121 with the ground layer 111 to form a shielding (step S470). Please refer to aforementioned FIGS. 1~3 for other implementation details of manufacture method of chip level EMI shielding structure of the instant embodiment, with no further elaboration given here.

It should be noted herein, the ground layer and the ground conductor line may be disposed on a special region of the wafer according to the design specifications, in forming a shielding on a specific semiconductor substrate to suppress the electromagnetic interference. The region, shape, and the quantity of the ground layer and the ground conductor line are not restricted herein.

To sum up, a metal layer, a first connection structure, and a second connection structure are formed on the backside and the lateral sides of the wafer separately to achieve the effect of shielding. The chip level EMI shielding structure of the instant disclosure has at least the following advantages: simplifies the chip level EMI shielding structure and reduces the chip size; decreases the manufacture cost; and enhances the stability of the chip.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A chip level EMI shielding structure, comprising:
   a semiconductor substrate having a thickness bounded by opposing first and second surfaces;
   a plurality of ground conductor lines disposed on the first surface of the semiconductor substrate, each of the ground conductor lines positioned on an edge of the semiconductor substrate;
   at least one chip disposed on the first surface of the semiconductor substrate;
   a protective layer directly contacting and covering the chip, ground conductor lines, and portions of the first surface of the semiconductor substrate surrounding the chip and ground conductor lines;
   a plurality of metal conductor lines each having a surface portion spaced from the semiconductor substrate and overlaying an outer surface of the protective layer, each of the metal conductor lines having an extending portion extending through the protective layer and connected electrically to the chip;
   a ground layer disposed on the second surface of the semiconductor substrate extending between a first connection structure and a second connection structure respectively disposed on lateral walls of the semiconductor substrate for electrically connecting the ground conductor lines and the ground layer.

2. The chip level EMI shielding structure as claimed in claim 1, wherein the semiconductor substrate is a Si-based substrate, and the semiconductor substrate comprises a redistribution layer (RDL) on the first surface thereof for connecting to the at least one chip.

3. The chip level EMI shielding structure as claimed in claim 1, wherein the connection structure is formed on the lateral wall of the semiconductor substrate by a non-plating process.

4. The chip level EMI shielding structure as claimed in claim 2, wherein the redistribution layer comprises a plurality of the metal conductor lines for connecting electrically to the at least one chip.

5. The chip level EMI shielding structure as claimed in claim 2, wherein the extending portion of the metal conductor lines is connected electrically to the redistribution layer.

* * * * *